United States Patent
Li et al.

(10) Patent No.: US 7,951,688 B2
(45) Date of Patent: May 31, 2011

(54) METHOD AND STRUCTURE FOR DIVIDING A SUBSTRATE INTO INDIVIDUAL DEVICES

(75) Inventors: Minhua Li, Sandy, UT (US); Qi Wang, Sandy, UT (US); Gordon Sim, Sandy, UT (US); Matthew Reynolds, Sandy, UT (US); Suku Kim, South Jordan, UT (US); James J. Murphy, South Jordan, UT (US); Hamza Yilmaz, Saratoga, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 113 days.

(21) Appl. No.: 12/174,863

(22) Filed: Jul. 17, 2008

(65) Prior Publication Data

US 2009/0181520 A1 Jul. 16, 2009

Related U.S. Application Data

(60) Provisional application No. 60/976,524, filed on Oct. 1, 2007.

(51) Int. Cl.
*H01L 21/30* (2006.01)
*H01L 21/46* (2006.01)

(52) U.S. Cl. ........ 438/458; 438/110; 438/118; 438/459; 438/462; 438/464; 257/E21.214; 257/E21.237; 257/E21.599

(58) Field of Classification Search .................. 438/110, 438/118, 458, 459, 462, 464; 257/E21.214, 257/E21.237, E21.599
See application file for complete search history.

(56) References Cited

U.S. PATENT DOCUMENTS

| | | | | |
|---|---|---|---|---|
| 4,729,971 A | * | 3/1988 | Coleman | 438/462 |
| 5,665,655 A | * | 9/1997 | White | 438/584 |
| 5,789,307 A | * | 8/1998 | Igel et al. | 438/464 |
| 5,977,641 A | * | 11/1999 | Takahashi et al. | 257/778 |
| 6,033,489 A | | 3/2000 | Marchant et al. | |
| 6,104,062 A | | 8/2000 | Zeng | |
| 6,429,481 B1 | | 8/2002 | Mo et al. | |
| 6,521,497 B2 | | 2/2003 | Mo | |
| 6,613,214 B2 | | 9/2003 | Dordi et al. | |
| 6,710,406 B2 | | 3/2004 | Mo et al. | |
| 6,828,195 B2 | | 12/2004 | Mo et al. | |
| 6,836,023 B2 | | 12/2004 | Joshi et al. | |
| 6,884,717 B1 | | 2/2005 | Desalvo et al. | |
| 7,098,108 B1 | | 8/2006 | Zeng | |
| 7,132,712 B2 | | 11/2006 | Kocon et al. | |
| 7,148,111 B2 | | 12/2006 | Mo et al. | |
| 2003/0003724 A1 | | 1/2003 | Uchiyama et al. | |

(Continued)

OTHER PUBLICATIONS

Baliga, pp. 335-349 from *Power Semiconductor Devices*, 1996.

(Continued)

*Primary Examiner* — Michelle Estrada
(74) *Attorney, Agent, or Firm* — Kilpatrick Townsend & Stockton LLP

(57) ABSTRACT

A method for obtaining individual dies from a semiconductor structure is disclosed. The semiconductor structure includes a device layer, and the device layer in turn includes active regions separated by predefined spacings. Thick metal is selectively formed on backside of the device layer such that thick metal is formed on backside of active regions but not on backside of the predefined spacings. The semiconductor structure is then cut along the predefined spacings to separate the active regions with thick metal on their backside into individual dies.

8 Claims, 9 Drawing Sheets

U.S. PATENT DOCUMENTS

| | | | |
|---|---|---|---|
| 2003/0119281 A1 | 6/2003 | Suzuki et al. | |
| 2005/0003586 A1* | 1/2005 | Shimanuki et al. | 438/124 |
| 2005/0167742 A1 | 8/2005 | Challa et al. | |
| 2006/0133443 A1* | 6/2006 | Chua et al. | 372/50.121 |
| 2007/0020884 A1 | 1/2007 | Wang et al. | |
| 2007/0173021 A1 | 7/2007 | Kocon et al. | |
| 2007/0235886 A1 | 10/2007 | Yilmaz et al. | |

OTHER PUBLICATIONS

Jian et al., "Effects on Etching Rates of Copper in Ferric Chloride Solutions," *IEMT/IMC Symposium*, $2^{nd}$, Symposium held Apr. 15-17, 1998, pp. 144-148.

Jostan et al., "Regeneration Process for Etching Solutions in the Production of Printed Circuits," Galvanotechnik, 70(10):940-945, article in German, English abstract included (1979).

Loher et al., "Smart PCBs Manufacturing Technologies," *IEEE* 9 pages from $6^{th}$ International Conference on Electronic Packaging Technology held Aug. 30, 2005 to Sep. 2, 2005 in Shenzhen, China.

International Search Report of Dec. 2, 2008 for corresponding International Application No. PCT/US08/77737.

Written Opinion of Dec. 2, 2008 for corresponding International Application No. PCT/US08/77737.

* cited by examiner

METHOD AND STRUCTURE FOR DIVIDING A SUBSTRATE INTO INDIVIDUAL DEVICES

CROSS-REFERENCES TO RELATED APPLICATIONS

This application claims the benefit of U.S. Provisional Application No. 60/976,524, filed Oct. 1, 2007, which is incorporated herein by reference in its entirety for all purposes.

BACKGROUND OF THE INVENTION

The present invention relates in general to semiconductor technology and in particular to techniques for dividing a substrate into a plurality of die structures.

Semiconductor manufacturing techniques utilize a number of processes to form semiconductor structures on substrates. The substrate is typically part of a wafer. A wafer is a small thin circular slice of a semiconductor material, such as silicon, on which semiconductor structures are formed. Standard device fabrication processes, such as etching, deposition, and plating are used to fabricate semiconductor structures on the wafer.

The substrate is often used to structurally support the semiconductor structures and prevent damage due to mechanical flexing. The substrate may also be used as part of the semiconductor structure, supporting vertical or lateral current flows. In some devices, the substrate is used as an insulator where the substrate is configured to insulate the semiconductor structure from other semiconductor structures or from electronically coupling to a conductive surface.

In some devices, the substrate is used as part of the current conduction path. Examples of such devices are solid-state switches including the power metal-oxide-semiconductor field effect transistor (power MOSFET), the insulated-gate bipolar transistor (IGBT) and various types of thyristors. Some of the defining performance characteristics for the power switch are its on-resistance (i.e., drain-to-source on-resistance, $R_{DSon}$), breakdown voltage, and switching speed.

Generally, smaller dimensions in semiconductor structures tend to reduce such parameters as resistance, power dissipation, and parasitic impedance. With regard to the semiconductor layers, for example, the thinner the semiconductor layers the better the semiconductor structure frequency of operation. Also, larger specific heat capacitance and more heat capacitive substrate materials tend to improve the heat dissipation characteristics of the semiconductor structures, whereas thinner substrates tend to improve frequency of operation for those devices that involve the substrate as part of the conduction path.

After the formation of the semiconductor structures, the wafer is tested and then diced up to separate individual semiconductor structures, generally referred to as dies. Conventional techniques for dividing a wafer into individual semiconductor structures have a number of drawbacks such as silicon chipping and cracking and die saw blade clogging. These and other drawbacks of conventional techniques are discussed in more detail below.

Accordingly, there is a need for improved techniques for dividing a wafer into individual semiconductor device structures.

BRIEF SUMMARY OF THE INVENTION

A method for obtaining individual dies from a semiconductor structure is disclosed in accordance with an exemplary embodiment. The semiconductor structure includes a device layer, and the device layer in turn includes active regions separated by predefined spacings. Thick metal is selectively formed on backside of the device layer such that thick metal is formed on backside of active regions but not on backside of the predefined spacings. The semiconductor structure is then cut along the predefined spacings to separate the active regions with thick metal on their backside into individual dies.

In one embodiment, a die sawing process is used to cut through the predefined spacings where thick metal is not formed.

In another embodiment, the predefined spacings comprise scribed line regions.

In another embodiment, the thick metal is formed using selective electroplating.

In another embodiment, prior to forming the thick metal layer, a seed layer is formed over and in contact with the backside of each active region. Each seed layer is separated by an adjacent seed layer by a vertically extending structure. A plating current is induced through each seed layer to thereby induce formation of a thick metal from the corresponding seed layer.

In yet another embodiment, the seed layer includes a metal layer and a diffusion barrier layer.

In yet another embodiment, the vertically extending structure is formed using a backside alignment masking process which aligns the vertically extending structure with the scribe line regions.

In still another embodiment, the device layer includes a FET structure, the FET structure in turn includes source regions in an upper portion of the device layer, a topside metal layer contacting the source regions, and a drain region extending into a lower portion of the device layer. The thick metal is in direct contact with the drain region along the backside of the device layer, and is thicker than the topside metal layer.

Another method for obtaining individual dies from a semiconductor structure is disclosed in accordance with yet another exemplary embodiment. The semiconductor structure includes a device layer, and the device layer in turn includes active regions separated by predefined spacings. A thick metal layer is formed on a backside of the device layer. Using a masking layer, portions of the thick metal layer are removed so that surface regions along a backside of the device layer are exposed such that the exposed surface regions are substantially aligned the predefined spacings. After removing portions of the thick metal layer, islands of thick metal layer remain on the backside of the device layer. After removing portions of the thick metal layer, the semiconductor structure is cut along the exposed backside surface regions.

In one embodiment, the predefined spacings comprise scribed line regions.

In another embodiment, the thick metal is formed using blanket electroplating.

In yet another embodiment, prior to forming the thick metal layer, a seed layer is formed over and in contact with backside of the device layer. A plating current is induced through the seed layer to thereby induce formation of a thick metal from the seed layer.

In yet another embodiment, the seed layer includes a metal layer and a diffusion barrier layer.

In still another embodiment, the portions of the thick metal layer are removed using a backside alignment masking process to ensure that in cutting the semiconductor structure, the thick metal layer is not cut through.

The following detailed description and the accompanying drawings provide a better understanding of the nature and advantages of the present invention.

DETAILED DESCRIPTION OF THE INVENTION

Figure 1A:
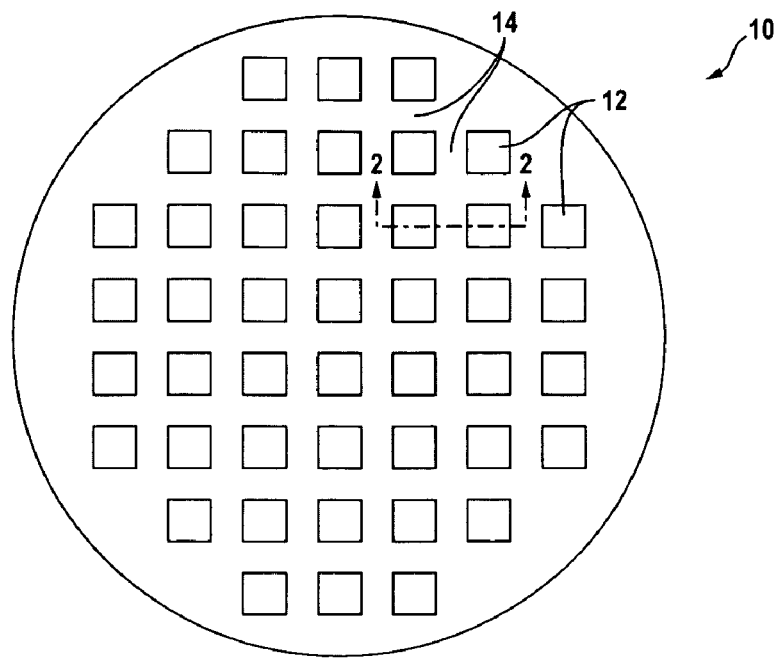
FIG. 1A is a schematic drawing showing a plurality of dies patterned on a substrate.

Referring to FIG. 1A, a substrate 10 may include a plurality of device regions or dies 12 separated by scribe line regions 14. Substrate 10 can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, device regions 12 may include transistors, diodes, capacitors, amplifiers, circuits, or various combinations thereof. Scribe line regions 14 may include at least one test device, test transistor, test diode, test circuit, alignment key, other test structure, or various combinations thereof. In some embodiments, substrate 10 may be a thinned substrate having a thickness between about 5 μm and about 20 μm. In a specific embodiment, each of device regions 12 may include a trench metal-oxide-semiconductor field effect transistor (MOSFET). An example is discussed in more details below.

Figure 1B:
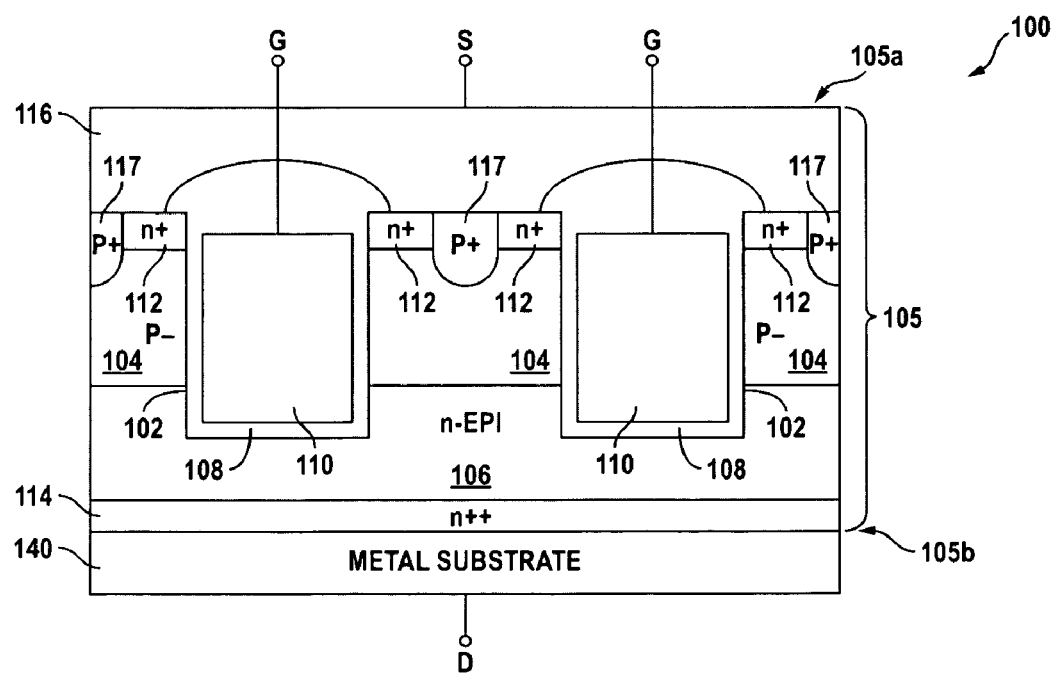
FIG. 1B is a magnified cross-sectional view of an exemplary substrate including at least one trench metal-oxide-semiconductor field effect transistor (MOSFET) such as n-type trench MOSFETs 100 that is formed in accordance with embodiments of the invention.

FIG. 1B is a magnified cross-sectional view of an exemplary trench metal-oxide-semiconductor field effect transistor (MOSFET) such as n-type trench MOSFET 100. In some embodiments, MOSFET 100 includes a device layer 105 over a metal substrate 140. Device layer 105 includes a top surface 105a and a bottom surface 105b. In some embodiments, device layer 105 includes a highly doped n++silicon layer 114, a lightly doped n-type epitaxial layer 106, and a p-type doped body region 104 (either formed in epi layer 106 by implant and diffusion or formed as a separate epi layer over n-type epi layer 106). Highly doped n+ source regions are formed in body region 104 adjacent trenches 102 using conventional implant and drive-in techniques. Trenches 102 extend through body region 104 and terminate in the drift reigon (i.e., the portion of epitaxial layer 106 that is bounded by body region 104 and n++ silicon layer 114). Trenches 102 are lined with dielectric layer 108 and include a gate electrode 110 (e.g., comprising doped or undoped polysilicon) therein. Highly doped p+ heavy body regions 117 are formed in body region 104 between adjacent source regions 112. A top-side source interconnect layer 116 (e.g., comprising metal) contacts source regions 112 and heavy body regions 117, but is insulated from gate electrodes 110 by a dielectric dome extending over each gate electrode 110. The drift region and n++ silicon layer together form the drain region of the MOSFET. Metal substrate 140 contacts the drain region along the backside of device layer 105.

It is to be understood, however, that the techniques of the present invention apply to both discrete devices as well as integrated circuits using any processing technology. As with all other figures described herein, it is to be understood that the relative dimensions and sizes of various elements and components depicted in the figures do not exactly reflect actual dimensions and are for illustrative purposes only.

In FIG. 1B, the device dimensions, such as layer thicknesses, are not drawn to proportion. For example, device layer 105 may have a thickness in the range of approximately 5-20 μm, whereas metal substrate 140 may be a thick metal having a thickness in the range of about 50-100 μm. In a manufacturing process, a number of MOSFET cells similar to those in FIG. 1B are fabricated in multiple dies on a single substrate that is then separated into individual devices. Many problems can occur if a conventional dicing process is used, especially when a thick copper (Cu) layer is used as metal substrate 140. Due to the ductile nature of Cu, it is difficult for a conventional silicon wafer die sawing process to maintain dicing quality and yield. For example, some of the problems include silicon chipping, cracking, blade clogging, and Cu burr, depending on the specific applications.

In accordance with various embodiments of the invention, techniques for forming a thick metal layer on the backside of a semiconductor device which eliminate the above-cited problems are described. Depending upon the embodiment, various features and advantages are obtained. These features include:

1. A method for forming thick backside metal using a selective electroplating process before a die sawing process;
2. Techniques for selective plating, such as forming re-entrant sidewall and selective etching;
3. A method for forming thick backside metal using a patterned etching process before a die sawing process; and
4. Techniques for forming thick backside metal for vertical trench devices.

The above features, as well as other features, may be implemented in one or more of the embodiments described next. These features are merely examples, which should not unduly limit the scope of the claims herein. One of ordinary skill in the art would recognize many variations, modifications, and alternatives.

The invention is not limited to any particular types of transistors and may be implemented in a variety of devices, for example, p-channel trench gate MOSFETs (i.e., a transistor similar in structure to that in FIG. 1B except that the conductivity type of all silicon regions is reversed), n-channel trench gate IGBT (i.e., a transistor similar in structure to that in FIG. 1B except that a p-type substrate is used instead of the n-type substrate), p-channel trench gate IGBT (i.e., a transistor similar in structure to that in FIG. 1B but with silicon regions of opposite conductivity except the substrate is kept n-type), shielded gate trench FET (i.e., a transistor similar in structure to that in FIG. 1B except that a shield electrode is formed under and is insulated from the gate electrode) and its n-channel and p-channel MOSFET varieties as well as its n-channel and p-channel IGBT verities, trench gate synchFET (i.e., monolithically integrated trench gate or shielded gate MOSFET and Schottky), planar gate varieties of the above devices (i.e., where the gate electrode extends laterally over a semiconductor region instead of vertically in a trench); and superjunction varieties of the above devices (i.e., devices with columns of alternating conductivity type silicon). Note that while a select number of power devices are cited above, the invention can be used in manufacturing other semiconductor device, including standard CMOS based devices.

Figure 2A:
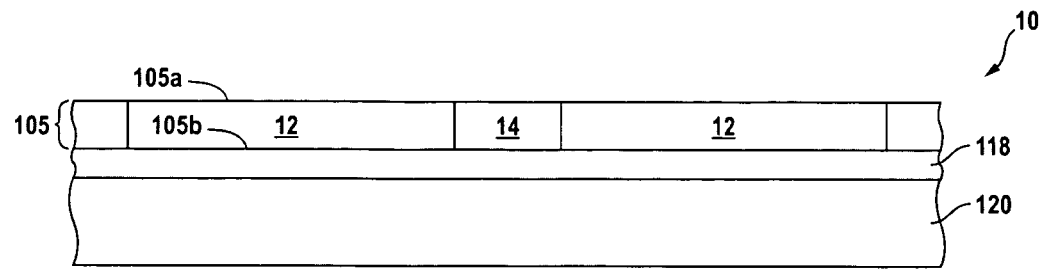
FIGS. 2A-2K are simplified cross-sectional views illustrating an exemplary method for dividing a substrate into a plurality of dies according to an embodiment of the present invention.

FIGS. 2A-2K are simplified cross-sectional views along section line 2-2 in FIG. 1A, showing an exemplary method for dividing an exemplary substrate into a plurality of dies according to an embodiment of the present invention. In FIG. 2A, device layer 105 has first surface 105a and second surface 105b, and includes device regions 12 separated by a plurality of scribe line regions 14. In one embodiment, first surface 105a corresponds to the top surface of a typical wafer. In some embodiments, each device region 12 may include trench device structures such as that shown in FIG. 1B or other types of semiconductor devices as stated above. In embodiments where device regions 12 include the MOSFET structure shown in FIG. 1B, device layer 105 with top and bottom surfaces 105a, 105b in FIG. 1B corresponds to device layer 105 with top and bottom surfaces 105a, 105b in FIG. 2A.

Device layer 105 in FIG. 2A is disposed over a dielectric layer 118, which in turn is disposed over a base substrate 120. In one embodiment, silicon wafer 120 serves as a base substrate for providing support to device layer 105 during various fabrication processes. In certain embodiments, part or all of base substrate 120 is removed in a subsequent process. In some embodiments, device layer 105 may have a thickness of about 10 μm.

In some embodiments, device layer 105 may be thermally, chemically and/or mechanically bonded with the dielectric layer 118. In still other embodiments, the structure in FIG. 2A may be formed using the technique for forming a silicon-on-insulator depicted in FIGS. 2-7 of the commonly assigned U.S. patent application Ser. No. 11/189,163, entitled "Semiconductor Structures Formed on Substrates and Methods of Manufacturing the Same," incorporated herein by reference in its entirety. In such embodiments, device layer 105 in FIG. 2A would correspond to layers 114B, 107, and 116 in FIG. 7 of the above-referenced application, and dielectric layer 118 in FIG. 2A of the present disclosure would correspond to dielectric layer 306 in FIG. 7 of the above-referenced application. Other techniques for forming the structure in FIG. 2A may also be used.

In some embodiments, dielectric layer 118 may be a silicon oxide layer, a nitride layer, an oxynitride layer, a silicon carbide layer, a silicon carbide nitride layer, or various combinations thereof. Dielectric layer 118 may be formed by, for example, a thermal oxidation process, a chemical vapor deposition (CVD) process, an ultra high vacuum chemical vapor deposition (UHVCVD) process, an atomic layer chemical vapor deposition (ALCVD) process, a metal organic chemical vapor deposition (MOCVD) process or other CVD process. In one embodiment, dielectric layer 118 is a silicon oxide layer having a thickness between about 1,000 Å and about 3,000 Å.

Figure 2B:
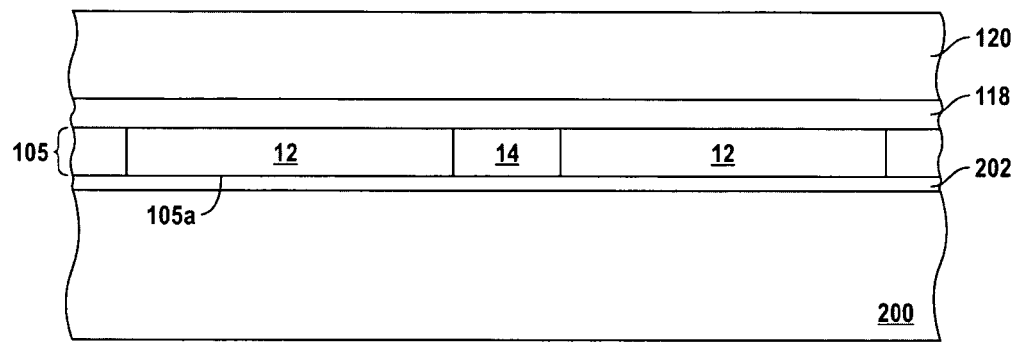

In FIG. 2B, the structure shown in FIG. 2A may be flipped and bonded over a support substrate 200 (e.g., a glass handle), such that surface 105a of device layer 105 faces support substrate 200. In some embodiments, device layer 105 may be bonded to support substrate 200 using an adhesive layer 202. In other embodiments, device layer 105 may be thermally, chemically, and/or mechanically bonded to support substrate 200. Support substrate 200 may provide a desired mechanical support for the subsequent step, and may comprise glass, a blank substrate, or a silicon substrate, for example. In some embodiments, adhesive layer 202 may have a thickness of about 50 μm. Support substrate 200 may have a thickness between about 500 μm and about 1 mm. Base substrate 120 may be grinded down to a desired thickness suitable for subsequent process steps. In one embodiment, base substrate 120 may have a final thickness of about 100 μm.

Figure 2C:
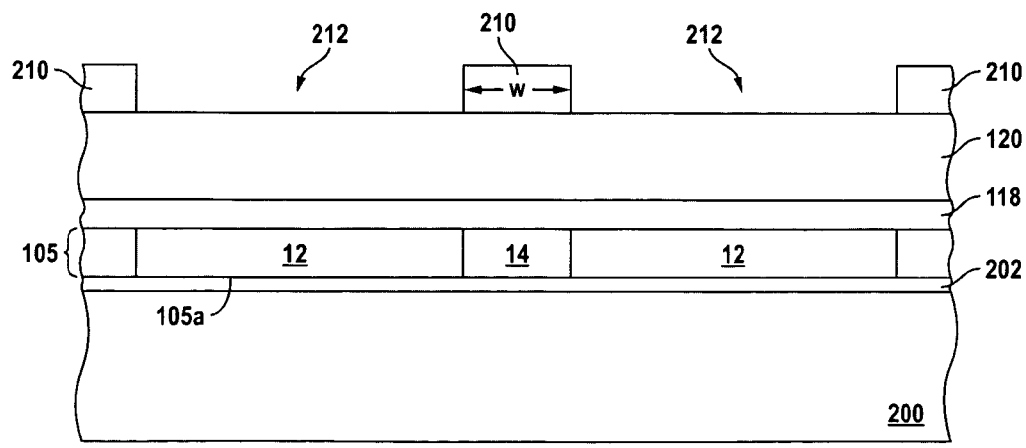

In FIG. 2C, patterned mask layer 210 is formed over base substrate 120. Patterned mask layer 210 includes openings 212 therein, and may comprise a polyimide layer, a photoresist layer, a hard mask layer such as a dielectric mask layer. In some embodiments, patterned mask layer 210 may be formed by a photolithographic process and/or an etch process. The photolithographic process may include known backside alignment techniques whereby the masking process for forming windows 212 on the back side is aligned with scribe lines 14 on the front side. Patterned mask layer 210 thus may be substantially vertically aligned with scribe line regions 14, though precise alignment may not be necessary. A width "w" of patterned mask layer 210 may be substantially equal to the width of scribe line region 14. In some embodiments, width "w" may be about 60 μm or more.

Figure 2D:
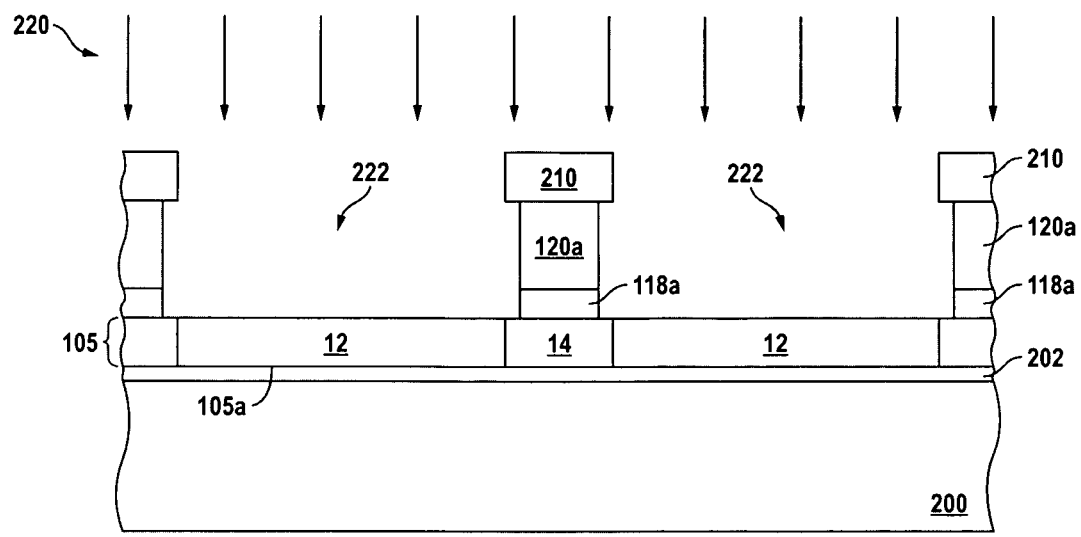

In FIG. 2D, with patterned mask layer 210 in place, one or more etch steps 220 may be carried out to remove a portion of base substrate 120 and a portion of dielectric layer 118 so as to expose portions of second surface 105b of device layer 105. Etch step 220 forms openings 222 between remaining dielectric layer portions 118a and the remaining base substrate portions 120a. In some embodiments, etch step 220 may include a dry etch step and/or a wet etch step. In one embodiment where base substrate 120 comprises doped silicon and dielectric layer 118 comprises silicon oxide, an isotropic wet etch of silicon is carried out using the silicon oxide as etch stop, followed by an isotropic wet etch of silicon oxide. Using isotropic etch process desirably results in lateral removal of portions of base substrate 120 and dielectric layer 118 directly below patterned mask layer 210. Openings 222 undercutting patterned mask layer 20 may thus be formed which advantageously aid in forming a discontinuous conductive layer (e.g., seed layer) as described next.

Figure 2E:
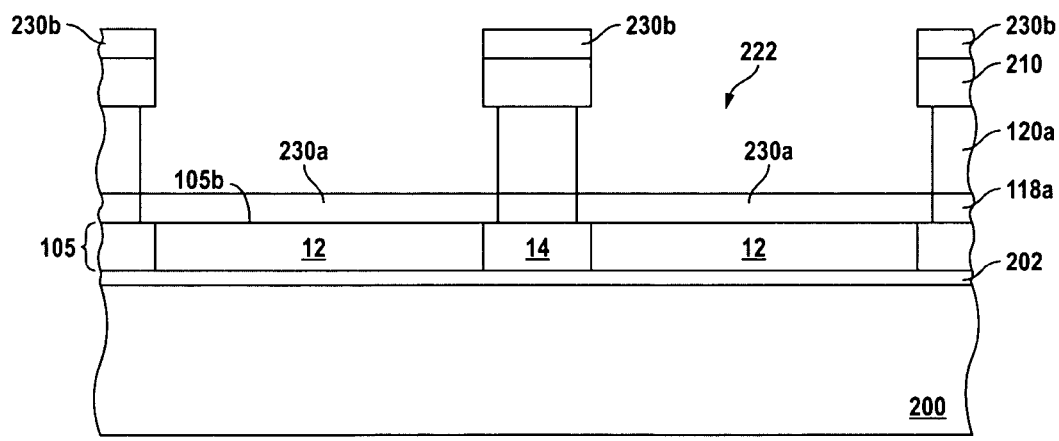

In FIG. 2E, lower conductive layers 230a may be formed over the exposed portions of surface 105b of device layer 10, and higher conductive layers 230b may be formed over patterned mask layer 210. Lower and upper conductive layers 230a, 230b may be simultaneously formed. Lower conductive layer 230a may comprise a seed metal layer and may further include at least one or both of an adhesive layer and a diffusion barrier. In some embodiments for forming an N-type MOSFET, the adhesive layer may comprise a titanium layer, the diffusion barrier may comprise a nickel layer, and the seed layer may comprise a copper layer. In other embodiments for forming a P-type MOSFET, the adhesive layer may comprise an aluminum layer, the diffusion barrier may comprise a nickel layer, and the seed layer may comprise a copper layer. The adhesive layer, the diffusion barrier and the seed layer may be formed by, for example, CVD process, physical vapor deposition (PVD) process, electroplating process, and/or an electrodeless plating process. The diffusion barrier layer may be configured relative to the seed layer so as to ensure that the subsequent metal plating process (described in reference to FIG. 2G) results in formation of metal only in the up direction. In some embodiments, lower conductive layers 230a may have a thickness between about 2,000 Å and about 7,000 Å. The adhesive layer may have a thickness of about 1,000 Å. The diffusion barrier may have a thickness of about 1,000 Å. The seed layer may have a thickness of about 3,000

Å. In some embodiments, patterned mask layer 210 is a patterned polyimide layer. Higher conductive layers 230b may be formed over such patterned polyimide mask layer, and would have the same composition as lower conductive layer 230a if formed at the same time as the lower conductive layer.

Where lower and upper conductive layers 230a, 230b are formed at the same time using, for example, a deposition process such as a PVD process, the undercut profile along sidewalls of openings 222 prevents the deposited conductive layer from forming along the sidewalls of openings 222. Lower conductive layers 230a would thus become discontinuous with upper conductive layers 230b. In other embodiments, openings 222 may be formed so that lower and upper conductive layers 230a or 230b are continuous along the sidewalls of openings 222. Known process techniques may then be used to remove the portions of the conductive layer extending along the sidewalls of openings 222.

Figure 2F:
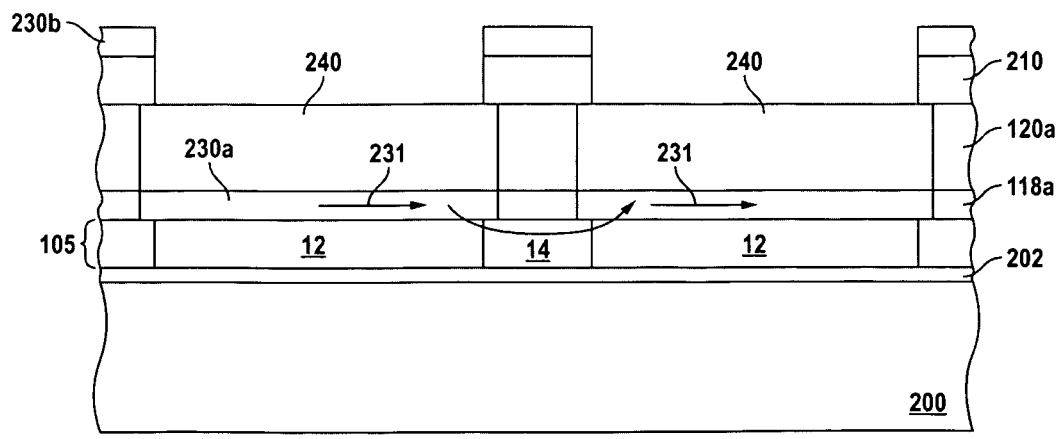

In FIG. 2F, conductive fill material 240 are formed over lower conductive layers 230a partially filling openings 222. Conductive fill material 240 may comprise one or more of copper, polysilicon, aluminum, aluminum copper, tungsten or other highly conductive material. Conductive fill material 240 may be formed by, for example, an electroplating process, a CVD process, a PVD process, an electrodeless plating process or other deposition process. In some embodiments, conductive fill material 240 is a thick metal layer and may have a thickness in the range of 25 μm-150 μm. In some embodiments, conductive fill material 240 serves as the metal substrate 140 (FIG. 1B) contacting the drain region of MOSFET 100 in FIG. 1B.

In some embodiments where conductive fill material 240 is formed using selective electroplating process, lower conductive layers 230a may be electrically coupled to plating electrodes (not shown). A plating current 231 then flows between the plating electrodes through the discrete lower conductive layers 230a and under dielectric islands 118a through the heavily doped region 114 (FIG. 1B) of device layer 105 (note that heavily doped region 114 (FIG. 1B) extends through both device region 12 and scribe line regions 14). During the electroplating process, lower conductive layers 230a serve as seed layers from which conductive fill material 240 (e.g., metal) forms in openings 222. Since upper conductive layers 230b are discontinuous with lower conductive layers 230a, plating current 231 does not flow through upper conducive layers 230b. Thus, conductive fill material 240 does not form over scribe line areas 14, hence the term "selective" electroplating. In one embodiment, conductive fill material is formed so as to have a top surface at or near the top surface base substrate portions 120a to accommodate the later dicing process.

Figure 2G:
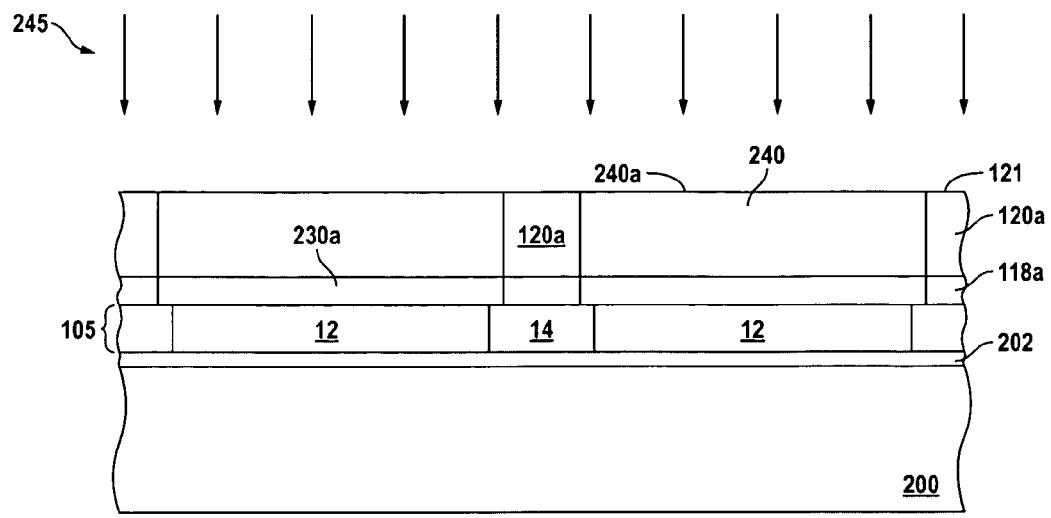

In FIG. 2G, a removing step 245 is carried out to remove upper conductive layers 230b and patterned mask layer 210. In some embodiments, removing step 245 may include a stripping process or a lift-off process for removing patterned mask layer 210 while stripping upper conductive layers 230b. In some embodiments, exposed surfaces 240a of conductive fill material 240 and exposed surface 121 of the remaining base substrate portions 120a may have a substantially coplanar surface. Additional known processes may be carried out to ensure a coplanar surface, if desired. Such coplanar surface of the structure in FIG. 2G may be desired for a dicing process described below with reference to FIG. 2J.

Figure 2H:
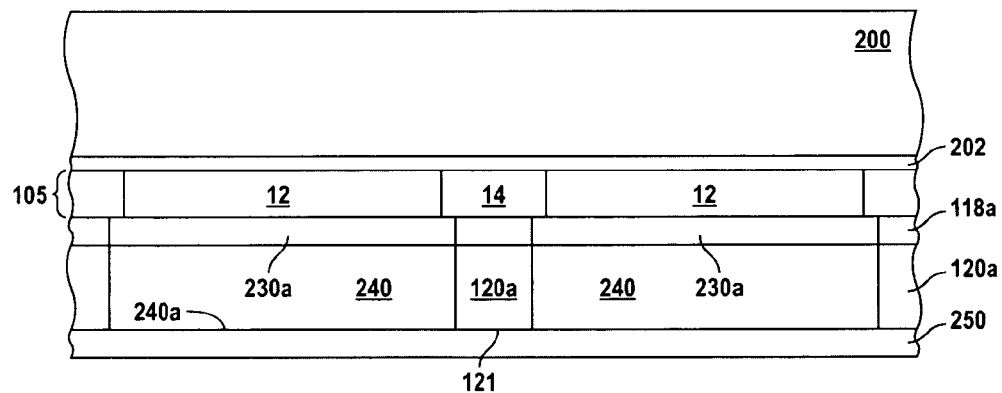
Figure 2I:
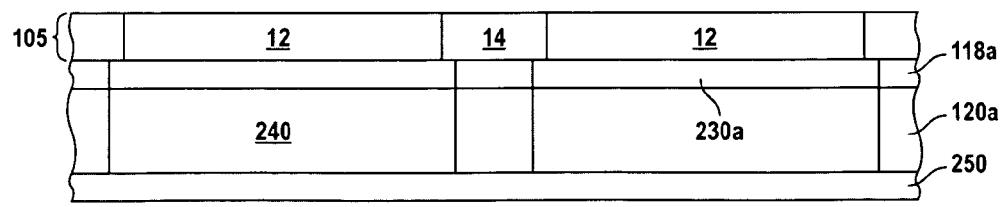

In FIG. 2H, the structure of FIG. 2G may be flipped and bonded to a tape such as a dicing tape 250. In some embodiments, dicing tape 250 is disposed over the structure of FIG. 2G and then the whole structure is flipped. In FIG. 2I, adhesive layer 202 and support substrate 200 may be removed by a thermal, chemical, physical and/or mechanical process to separate adhesive layer 202 and support substrate 200 from device layer 105.

Figure 2J:
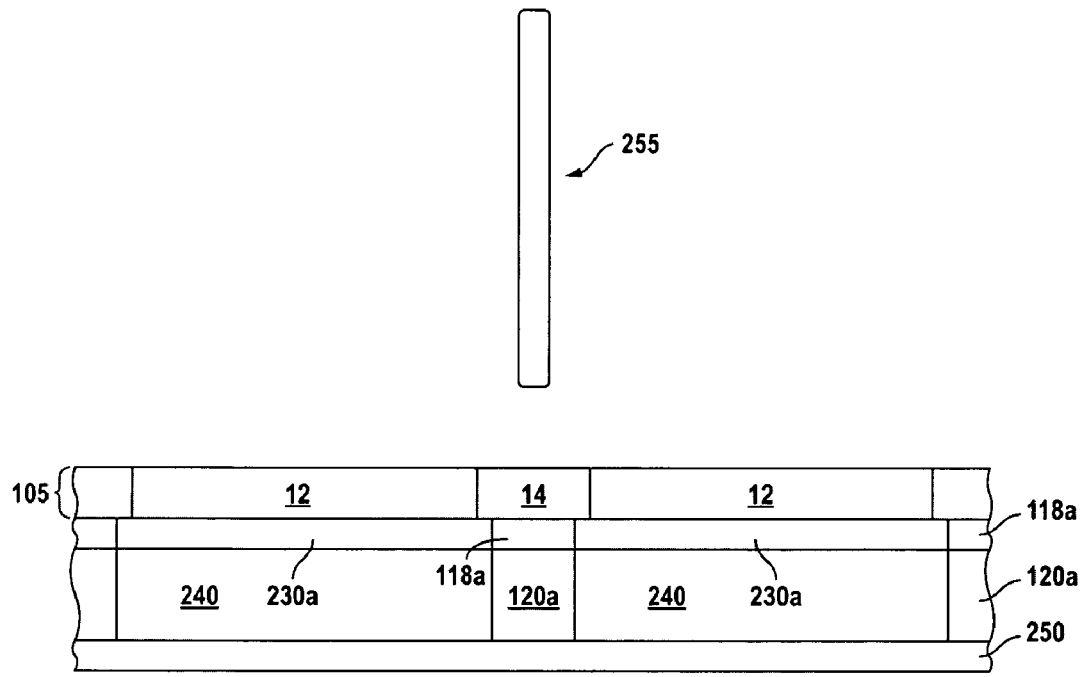
Figure 2K:
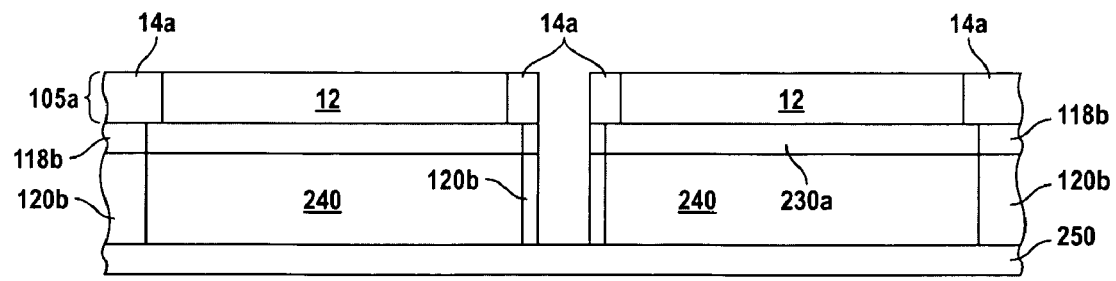

In FIG. 2J, a dicing process uses, for example a blade 255, to cut the structure into a plurality of dies. The structure in FIG. 2J may be diced along the top surface or along the bottom surface. In some embodiments, the dicing process may be a laser dicing process. In other embodiments, the dicing process may be a water-jet dicing process. The structure shown in FIG. 2J is divided by cutting through scribe line regions 14, dielectric layer portions 118a, and base substrate portions 120a. By carefully selecting the width of scribe line regions 14 and its underlying regions in FIG. 2J for a given dicing process, one can ensure that blade 255 does not contact, or minimally contacts, conductive fill material 240 and/or lower conductive layers 230a during the dicing process. This is illustrated more clearly in FIG. 2K which shows the cut dies after the dicing process. As can be seen, after the dicing, lower conductive layers 230 remain surrounded by remaining portions 118b of dielectric layers 118a. Similarly, conductive fill material 240 remain surrounded by remaining portions 120b of base substrate 120a. Further, portions 14a of scribe line regions 14 remain around device regions 12. Thus, by preventing the blade from coming in contact with conductive fill material 240 or lower conductive material 230a, the prior art problems such as silicon chipping or cracking, blade clogging and/or metallic burrs caused by the process of dicing through thick metal layers are advantageously eliminated. This is in part achieved by forming islands of metal 240 that are aligned with active regions 12 rather than the conventional techniques where a continuous metal layer extending along the entire backside of the wafer is formed before the dicing process.

Figure 3A:
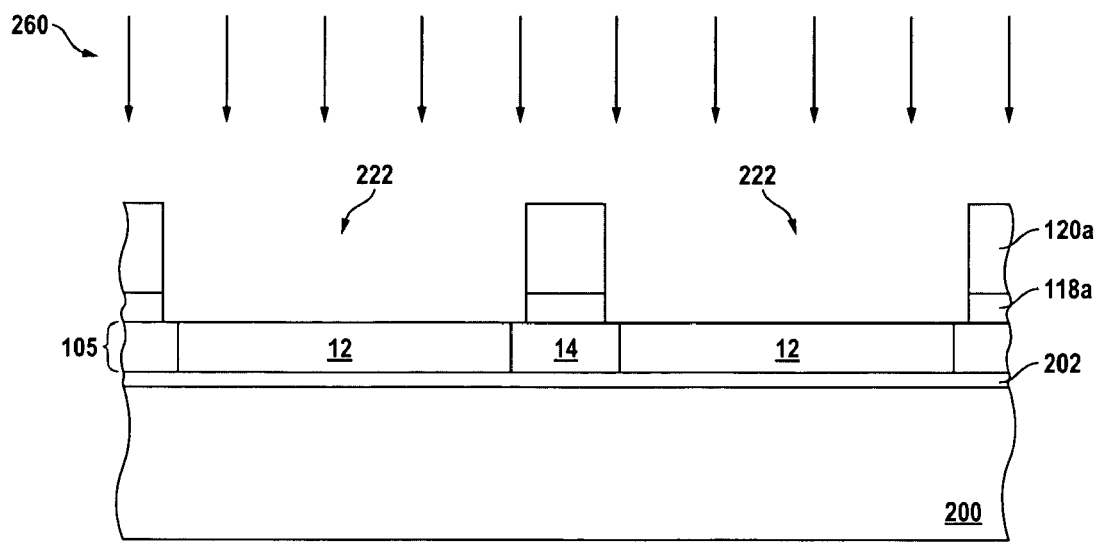
FIGS. 3A-3C are simplified cross-sectional views illustrating an exemplary method for forming a conductive layer formed after the step described in reference to FIG. 2D, according to another embodiment of the present invention.
Figure 3B:
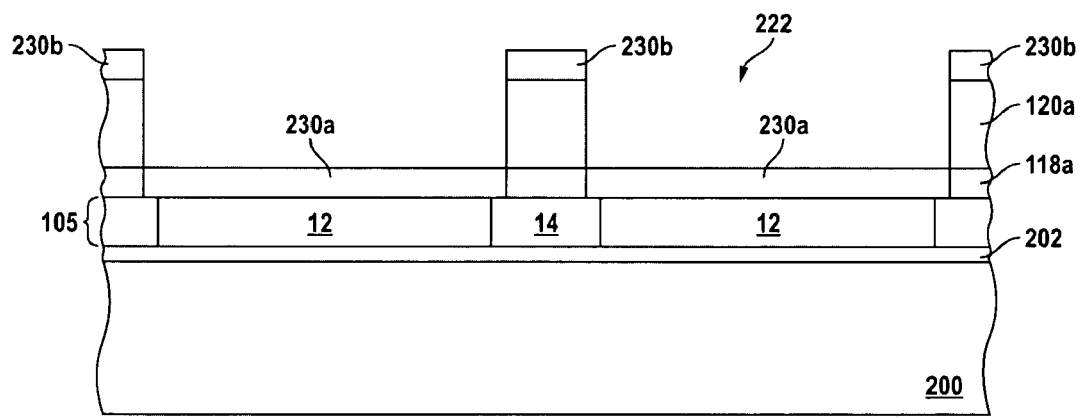
Figure 3C:
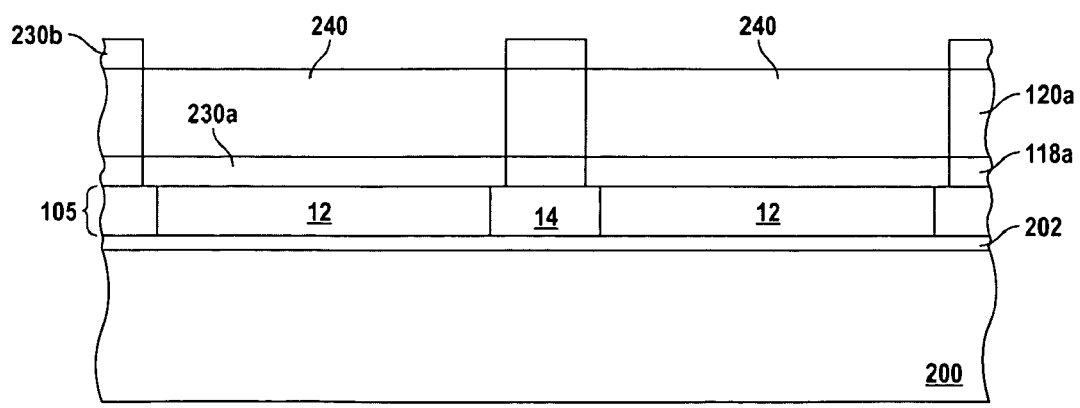

FIGS. 3A-3C are cross-sectional views showing an alternative exemplary method for forming conductive fill material 240 in openings 222 after the step corresponding to FIG. 2D. After forming openings 222 as described above in conjunction with FIG. 2D, a removing step 260 may be carried out to substantially remove patterned mask layer 210 as shown in FIG. 3A. Removing step 260 may be a dry etch and/or a wet etch process.

In FIG. 3B, lower and upper conductive layers 230a, 230b may be formed in a manner similar to that described above in reference to FIG. 22E. In FIG. 3C, conductive fill material 240 is formed within openings 222. In some embodiments, the materials and methods for forming conductive fill material 240 may be similar to those described above in reference to FIG. 2F. After forming conductive fill material 240, upper conductive layers 230b may be removed by a dry etch step and/or a wet etch step (not shown) so as to form a planar surface similar to that shown in FIG. 2G. Alternatively, upper conductive layers 230b may be left intact and the electroplating process may be tweaked so that a top surface of conductive fill material 240 becomes more planar with a top surface of upper conductive layer 230b. The steps described above in reference to FIGS. 2H-2K may be performed next so as to divide device layer 105 into a plurality of dies 105a.

Figure 4A:
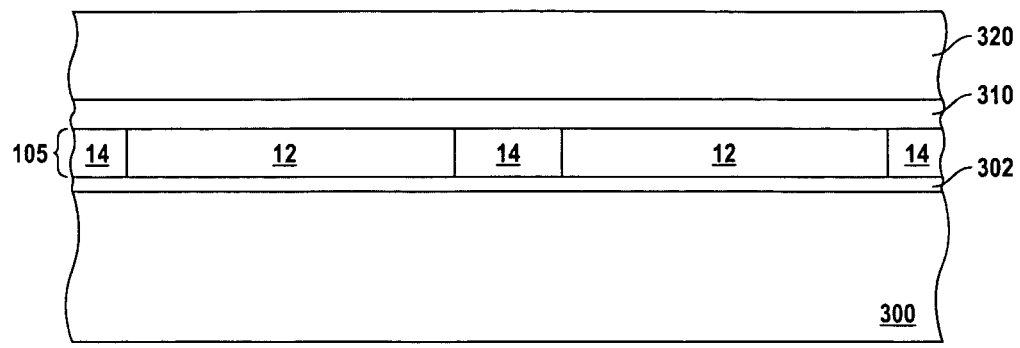
FIGS. 4A-4H are simplified cross-sectional views illustrating another exemplary method for dividing a substrate into a plurality of dies according to yet another embodiment of the present invention.

FIGS. 4A-4H are simplified cross-sectional views showing another exemplary method for dividing an exemplary substrate into a plurality of dies according to an alternative embodiment of the invention. In FIG. 4A, device layer 105 is disposed over a support substrate 300. Device layer 105 includes device regions 12 and scribe line regions 14. In some embodiments, device layer 105 may be bonded over support substrate 300 by adhesive layer 302. In other embodiments, device layer 105 may be thermally, chemically, physically, and/or mechanically bonded over support substrate 300. Adhesive layer 302 and support substrate 300 may be similar, structurally and in the manner they are formed, to adhesive layer 202 and support substrate 200, respectively, described above in connection with FIG. 2B.

Thinner conductive layer 310 and thicker conductive layer 320 are sequentially formed over device layer 105. Thinner conductive layer 310 may comprise a seed metal layer and may further include one or both of an adhesive layer and a diffusion barrier. In some embodiments for forming an N-type MOSFET, the adhesive layer may comprise a titanium layer, the diffusion barrier may comprise a nickel layer, and the seed layer may comprise a copper layer. In other embodiments for forming a P-type MOSFET, the adhesive layer may comprise an aluminum layer, the diffusion barrier may comprise a nickel layer, and the seed layer may comprise a copper layer. The adhesive layer, the diffusion barrier and the seed layer may be formed by, for example, a CVD process, a physical vapor deposition (PVD) process, an electroplating process, and/or an electrodeless plating process. In some embodiments, thinner conductive layer 310 may have a thickness between about 2,000 Å and about 7,000 Å. The adhesive layer may have a thickness of about 1,000 Å. The diffusion barrier may have a thickness of about 1,000 Å. The seed layer may have a thickness of about 3,000 Å.

Thicker conductive layer 320 may comprise one or more of copper, polysilicon, aluminum, aluminum copper, tungsten, or other highly conductive material. Thicker conductive layer 320 may be formed by, for example, a electroplating process, a CVD process, a PVD process, an electrodeless plating process or other deposition process. In some embodiments, thicker conductive layer 320 may have a thickness between about 25 μm and about 100 μm. Where thicker conductive layer 320 is formed using blanket electroplating, a continuous layer of conductive layer is formed on the structure, hence the term "blanket" electroplating (as opposed to "selective" electroplating which results in formation of discrete portions of conductive material as shown and describe in reference to FIG. 2F).

Figure 4B:
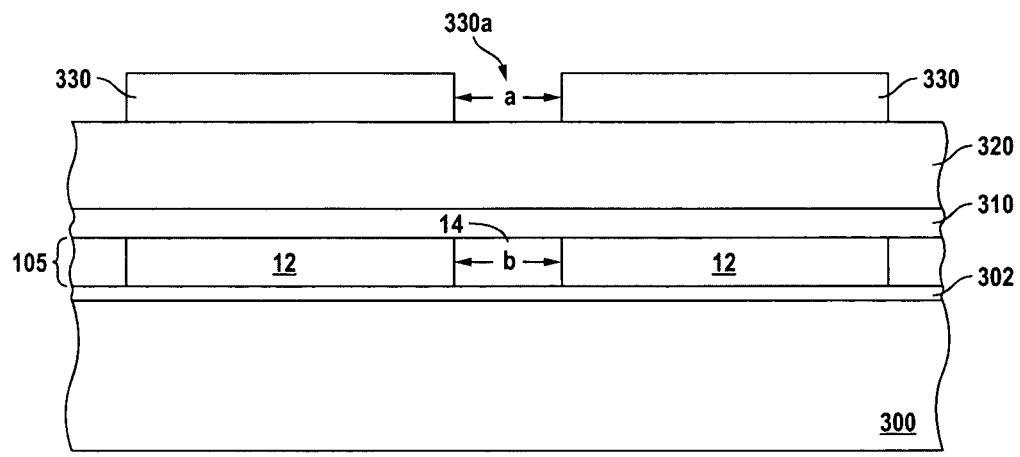

In FIG. 4B, a patterned mask layer 330 may be formed over thicker conductive layer 320. Patterned mask layer 330 includes opening 330a corresponding to scribe line regions 14 of device layer 105. Patterned mask layer 330 can be, for example, a photoresist layer, a polyimide layer, a hard mask layer such as a dielectric hard mask layer, or other material. In some embodiments, patterned mask layer 330 may be formed by a photolithographic process and/or an etch process. The photolithographic process may include known backside alignment techniques whereby the masking process for forming windows 330a on the back side is aligned with scribe lines 14 on the front side. Patterned mask layer 330 thus may have a width "a" substantially equal to the width "b" of scribe line regions 14, and openings 330a may be substantially vertically aligned with scribe line regions 14. In some embodiments, width "a" may be about 60 μm or less.

Figure 4C:
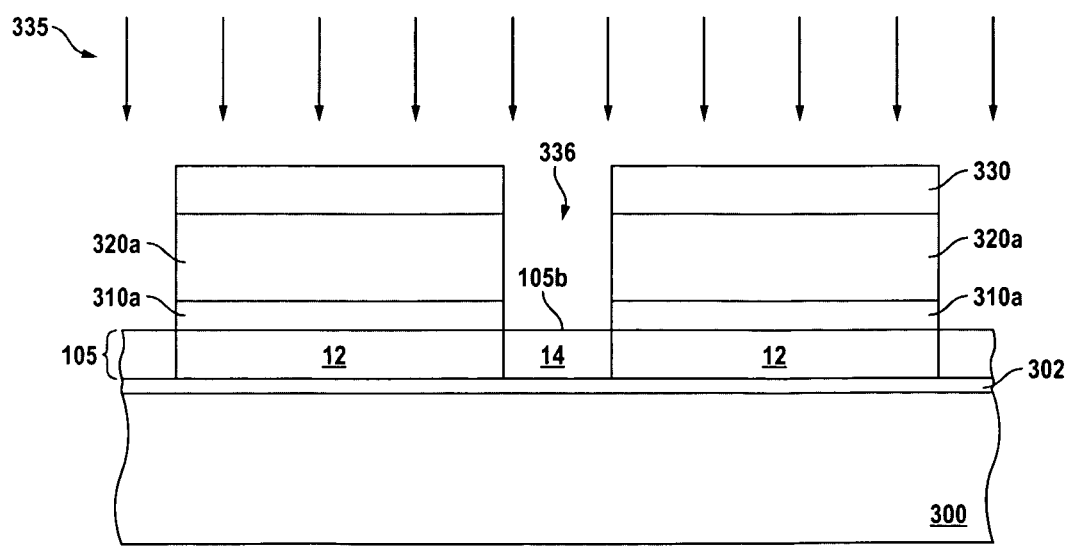

In FIG. 4C, an etch step 335 removes portions of thicker conductive layer 320 and thinner conductive layer 310 using the patterned mask layer 330 as an etch mask so as to expose a portion of surface 105b of device layer 105. In some embodiments, etch step 335 may be a dry etch and/or a wet etch. In one embodiment, etch step 335 is a wet etch which may remove the portions of conductive layers 310 and 320 with a desired etch rate.

Figure 4D:
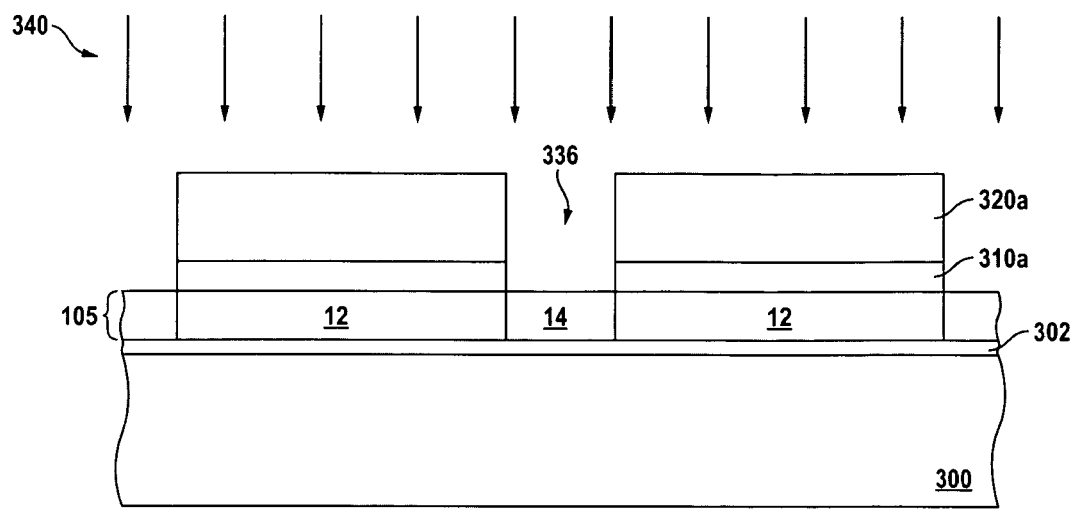
Figure 4E:
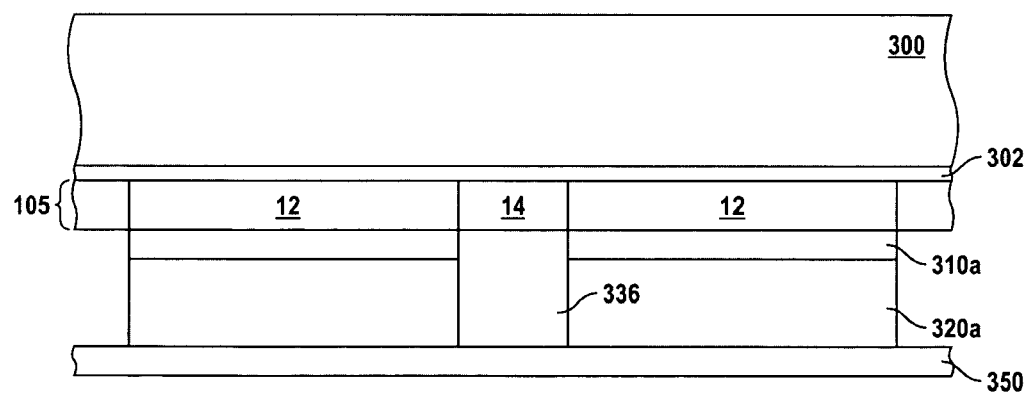
Figure 4F:
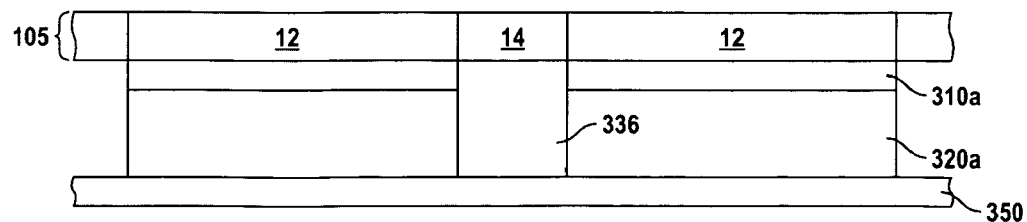

As described above in reference to FIG. 4B, with width "a" of openings 330a substantially equal to and aligned with width "b" of scribe line regions 14, exposed portions of surface 105a correspond to surfaces of scribe line regions 14 as shown. In FIG. 4D, a removing step 340 substantially removes patterned mask layer 330. Removing step 340 may be a dry etch step and/or a wet etch step. In FIG. 4E, the structure of FIG. 4D may be flipped and bonded over a tape such as a dicing tape 350. In some embodiments, dicing tape 350 is bonded over the structure of FIG. 4D and then the whole structure is flipped. In FIG. 4F, adhesive layer 302 and support substrate 300 may be removed by a thermal, chemical, physical and/or mechanical process to separate adhesive layer 302 and support substrate 300 from the device layer 105.

Figure 4G:
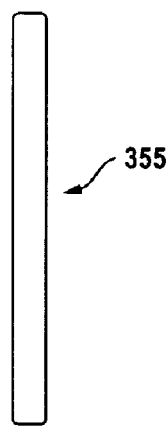
Figure 4G:
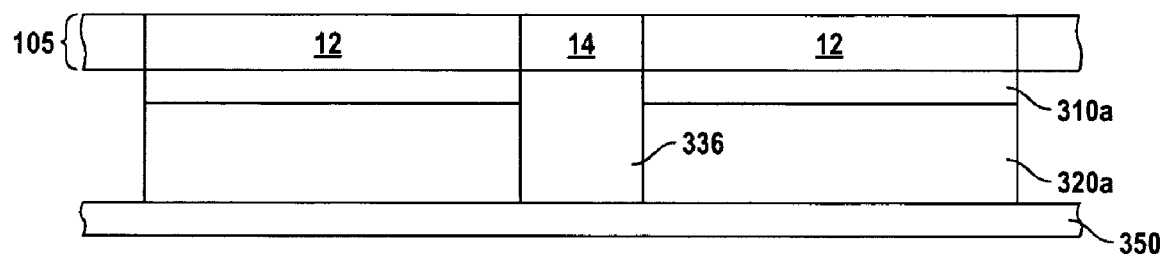
Figure 4H:
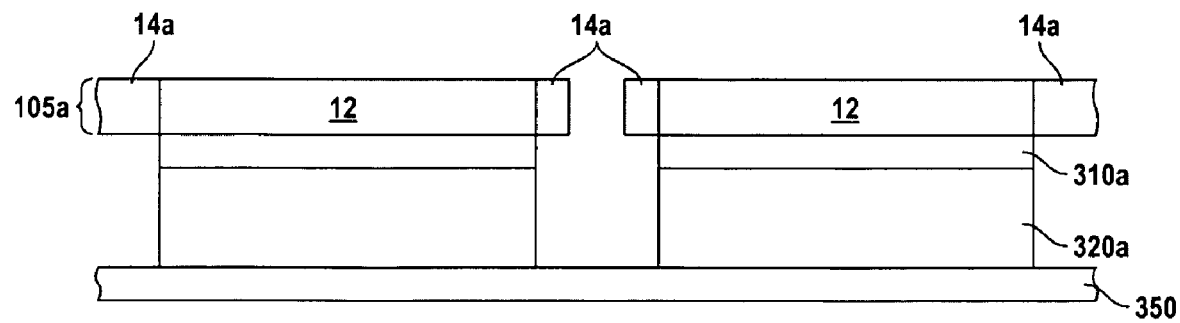

In FIG. 4G, a dicing process uses, for example a blade 355, to cut the structure into a plurality of dies. The structure in FIG. 4G may be diced along the top surface or along the bottom surface. In some embodiments, the dicing process may be a laser dicing process. In other embodiments, the dicing process may be a water-jet dicing process. The structure shown in FIG. 4G is divided by cutting through scribe line regions 14. By carefully selecting the width of scribe line regions 14 for a given dicing process, one can ensure that blade 355 does not contact, or minimally contacts, conductive layer portions 310a, 310b during the dicing process. This is illustrated more clearly in FIG. 4H which shows the cut dies after the dicing process. As can be seen, after the dicing, outer portions 14a of scribe line regions 14 remain. This ensures that blade 355 do not contact conductive layers 310a, 310b. Thus, by preventing the blade from coming in contact with the thicker conductive layer 310b, the prior art problems such as silicon chipping or cracking, blade clogging and/or metallic burrs caused by the process of dicing through thick metal layers are advantageously eliminated. This is in part achieved by forming openings 336 that are aligned with scribed line regions 14 prior to dicing.

Although a number of specific embodiments are shown and described above, embodiments of the invention are not limited thereto. Therefore, the scope of the present invention should be determined not with reference to the above description but should be determined with reference to the appended claims, along with their full scope of equivalents.

What is claimed is:

1. A method for obtaining individual dies from a semiconductor structure that includes a device layer, the device layer in turn including active regions separated by predefined spacings, the method comprising:
   selectively forming a metal layer on backside of the device layer such that the metal layer is formed on backside of active regions but not on backside of the predefined spacings; and
   cutting the semiconductor structure along the predefined spacings to separate the active regions with the metal layer on their backside into individual dies.

2. The method of claim 1 wherein cutting along the predefined spacings comprises using a die sawing process to cut through the predefined spacings where the metal layer is not formed.

3. The method of claim 2 wherein the predefined spacings comprise scribed line regions.

4. The method of claim 1 wherein the metal layer is formed using selective electroplating.

5. The method of claim 1 further comprising:
   prior to forming the metal layer, forming a seed layer over and in contact with the backside of each active region, each seed layer being separated by an adjacent seed layer by a vertically extending structure, the vertically extending structure extending to a height above the seed layer; and inducing a plating current through each seed layer to thereby induce formation of the metal layer from the corresponding seed layer.

6. The method of claim 5 wherein the seed layer includes a metal layer and a diffusion barrier layer.

7. The method of claim 5 wherein the vertically extending structure is formed using a backside alignment masking process which aligns the vertically extending structure with the scribe line regions.

8. The method of claim 1 wherein the device layer includes a FET structure, the FET structure including:
source regions in an upper portion of the device layer,
a topside metal layer contacting the source regions; and
a drain region extending into a lower portion of the device layer, wherein the metal layer is in direct contact with the drain region along the backside of the device layer, the metal layer being thicker than the topside metal layer.

* * * * *